(12) United States Patent
Smink et al.

(10) Patent No.: US 10,359,487 B2
(45) Date of Patent: Jul. 23, 2019

(54) ZERO ECHO TIME MR IMAGING

(71) Applicant: KONINKLIJKE PHILIPS N.V., Eindhoven (NL)

(72) Inventors: Jouke Smink, Eindhoven (NL); Johannes Petrus Groen, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 215 days.

(21) Appl. No.: 15/510,068

(22) PCT Filed: Sep. 8, 2015

(86) PCT No.: PCT/EP2015/070519
§ 371 (c)(1),
(2) Date: Mar. 9, 2017

(87) PCT Pub. No.: WO2016/038048
PCT Pub. Date: Mar. 17, 2016

(65) Prior Publication Data
US 2017/0261577 A1   Sep. 14, 2017

(30) Foreign Application Priority Data

Sep. 12, 2014 (EP) .................................. 14184590

(51) Int. Cl.
*G01R 33/48* (2006.01)
*G01R 33/56* (2006.01)
*G01R 33/565* (2006.01)

(52) U.S. Cl.
CPC ..... *G01R 33/4816* (2013.01); *G01R 33/4826* (2013.01); *G01R 33/56* (2013.01); *G01R 33/565* (2013.01)

(58) Field of Classification Search
CPC .............. G01R 33/4816; G01R 33/565; G01R 33/4826; G01R 33/56
See application file for complete search history.

(56) References Cited

U.S. PATENT DOCUMENTS

2016/0313421 A1* 10/2016 Fuderer .............. G01R 33/4816

FOREIGN PATENT DOCUMENTS

WO    2006120584 A1    11/2006

OTHER PUBLICATIONS

Weiger et al "ZTE Imaging in Humans" Magnetic Resonance in Medicine, vol. 70, No. 2 p. 328-332 (2013).

(Continued)

*Primary Examiner* — G. M. A Hyder

(57) ABSTRACT

The invention relates to a method of MR imaging of an object positioned in an examination volume of a MR device (1). It is an object of the invention to enable 'silent' ZTE imaging with improved sampling of k-space center. According to the invention, the object (10) is subjected to an imaging sequence of RF pulses (20) and switched magnetic field gradients, which imaging sequence is a zero echo time sequence comprising: i) setting a readout magnetic field gradient having a readout direction and a readout strength (G1, G2); ii) radiating a RF pulse (20) in the presence of the readout magnetic field gradient; iii) acquiring a FID signal in the presence of the readout magnetic field gradient, wherein the FID signal represents a radial k-space sample (31, 32), wherein the acquisition of the FID signal is started at an acquisition time at which a receiver gain of the MR device (1) has not yet stabilized after the radiation of the RF pulse (20); iv) incrementally varying the readout direction; v) sampling a spherical volume in k-space by repeating steps i) through iv) a number of times. Finally, a MR image is reconstructed from the acquired FID signals. Moreover, the (Continued)

invention relates to a MR device and to a computer program for a MR device.

8 Claims, 2 Drawing Sheets

(56) References Cited

OTHER PUBLICATIONS

Grodzki et al "Ultrashort Echo Time Imaging Using Pointwise Encodign Time Reduction.." Magnetic Resonance in Medicine, vol. 67, No. 2 p. 510-518 (2012).

Markus Weiger et al: "MRI with zero echo time: Hard versus sweep pulse excitation".Magnetic Resonance in Medicine,vol. 66, No. 2, Mar. 4, 2011 (Mar. 4, 2011),pp. 379-389.

Kuethe D O et al: "Transforming NMR Data Despite Missing Points",Journal of Magnetic Resonance, Academic Press, Orlando, PL, US, vol. 139, No. 1, Jul. 1, 1999 (Jul. 1, 1999),pp. 18-25.

Jackson J et al: "Low-Frequency Restoration",Magnetic Resonance in Medicine, John Wiley & Sons, Inc, US,vol. 11, No. 2, Aug. 1, 1989 (Aug. 1, 1989),pp. 248-257.

Wu et al "Water-and Fat Supression ProtonProjection MRI" MRM 57:544-567 (2007).

\* cited by examiner

ZERO ECHO TIME MR IMAGING

CROSS REFERENCE TO RELATED APPLICATIONS

This application is a U.S. national phase application of International Application No. PCT/EP2015/070519, filed on Sep. 8, 2015, which claims the benefit of EP Application Serial No. 14184590.9 filed on Sep. 12, 2014 and are incorporated herein by reference.

FIELD OF THE INVENTION

The invention relates to the field of magnetic resonance (MR) imaging. It concerns a method of MR imaging. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field ($B_0$ field) whose direction at the same time defines an axis (normally the z-axis) of the co-ordinate system on which the measurement is based. The magnetic field produces different energy levels for the individual nuclear spins in dependence on the magnetic field strength which can be excited (spin resonance) by application of an electromagnetic alternating field (RF field, also referred to as $B_1$ field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse), so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of one or more receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneity) from an ordered state with the same phase to a state in which all phase angles are uniformly distributed (dephasing). The dephasing can be compensated by means of a refocusing pulse (for example a 180° pulse). This produces an echo signal (spin echo) in the receiving coils.

In order to realize spatial resolution in the body, linear magnetic field gradients extending along the three main axes are superposed on the uniform magnetic field, leading to a linear spatial dependency of the spin resonance frequency. The signal picked up in the receiving coils then contains components of different frequencies which can be associated with different locations in the body. The MR signal data obtained via the RF coils corresponds to the spatial frequency domain and is called k-space data. The k-space data usually includes multiple lines acquired with different phase encoding. Each line is digitized by collecting a number of samples. A set of k-space data is converted to a MR image by means of Fourier transformation or other appropriate reconstruction algorithms.

MR imaging of tissues with very short transverse relaxation times, such as bone or lung, is becoming increasingly important. Known methods for this purpose basically employ three-dimensional (3D) radial k-space sampling. In the so-called zero echo time (ZTE) technique a readout gradient is set before excitation of magnetic resonance with a high-bandwidth and thus short, hard RF pulse. In this way, gradient encoding starts instantaneously upon excitation of magnetic resonance. The acquisition of a free induction decay (FID) signal starts immediately after radiation of the RF pulse resulting in an effectively zero 'echo time' (TE). After the FID readout, only minimal time is required for setting of the next readout gradient before the next RF pulse can be applied, thus enabling very short repetition times (TR). The readout direction is incrementally varied from repetition to repetition until a spherical volume in k-space is sampled to the required extent. Without the need for switching off the readout gradient between TR intervals, ZTE imaging can be performed virtually silently (see Weiger et al, Magnetic Resonance in Medicine, vol. 70, p. 328-332, 2013).

A challenge in ZTE imaging is that the k-space data are slightly incomplete in the k-space center due to the initial dead time that is caused by the finite duration of the RF pulse, transmit-receive switching, and signal filtering.

This k-space gap can be addressed, for example, by combining the radial ZTE sampling with extra Cartesian sampling of the k-space center, like in the known PETRA technique (see Grodzki et al, Magnetic Resonance in Medicine, vol. 67, p. 510-518, 2012).

SUMMARY OF THE INVENTION

From the foregoing it is readily appreciated that there is a need for an improved method of ZTE imaging. It is an object of the invention to enable 'silent' ZTE imaging with sampling of k-space center.

In accordance with the invention, a method of MR imaging of an object positioned in the examination volume of a MR device is disclosed. The method of the invention comprises the steps of:

subjecting the object to an imaging sequence of RF pulses and switched magnetic field gradients, which imaging sequence is a zero echo time sequence comprising:

i) setting a readout magnetic field gradient having a readout direction and a readout strength;

ii) radiating a RF pulse in the presence of the readout magnetic field gradient;

iii) acquiring a FID signal in the presence of the readout magnetic field gradient, wherein the FID signal represents a radial k-space sample, wherein the acquisition of the FID signal is started already during the receiver dead time, i.e. at an acquisition time at which a receiver gain of the MR device has not yet stabilized after the radiation of the RF pulse;

iv) gradually varying the readout direction;

v) sampling a spherical volume in k-space by repeating steps i) through iv) a number of times;

reconstructing a MR image from the acquired FID signals.

According to the invention, the radial ZTE acquisition is principally applied in the conventional fashion. MR signals are acquired as radial k-space samples by repeating the radiation of RF pulses while the readout direction is gradually varied until a desired volume in k-space is sampled and a MR image can be reconstructed from the acquired MR signals. However, the invention proposes that the readout strength is varied such that at least some of the FID signals are acquired with different readout strengths.

Preferably, the readout strength is varied such that at least two FID signals are acquired, both with substantially the same readout direction but each with another readout strength.

As mentioned above, acquisition of FID signals from the centre region of k-space is principally corrupted due to the finite dead time caused by the duration of the RF pulse, transmit-receive switching, and signal filtering. In other words, during the dead time the receiver gain of the MR device has not yet achieved its stable level. It is an insight of the present invention that the onset of the receiver gain may not be stable, but it is nevertheless well reproducible. Thus, the temporal receiver gain variation during the dead time can be derived according to the invention by comparing k-space samples acquired at identical k-space positions but at different acquisition times after radiation of the RF pulse. This enables to start the acquisition of the FID signals already during the dead time, that is, at an acquisition time at which the receiver gain of the MR device has not yet stabilized after the radiation of the RF pulse. According to the invention, the temporal variation of the receiver gain can be compensated for in the acquired FID signals such that a MR image can be reconstructed from the FID signals that is free from artefacts caused by signal corruption during the receiver dead time. An insight of the present invention is that the receive gain may vary, but the onset variation is quite reproducible so that it can be compensated for. The required compensation can be obtained from separate calibration, simulations of the temporal RF receiver gain. The temporal receiver gain can also be determined from the hard-ware properties of the RF receiver equipment. According to a further optional aspect of the invention, the required compensation is obtained within the ZTE-sequence by comparing k-space samples at identical k-space positions but at different acquisition times. Any difference between the signal levels between signals form the same k-space position but different acquisition time is representative for the effective receiver gain variations. Hence, from that difference the receiver gain variation can be computed. The exact details of that computation are optional implementation details.

Consequently, the invention enables a more accurate acquisition of FID signals from the centre of k-space in a ZTE acquisition scheme. The invention thus improves the image quality of ZTE/silent scanning.

In a preferred embodiment of the invention, at least one of the FID signals is acquired at zero readout strength. The measurement at zero readout strength directly provides the missing information at k=0. Such a measurement can be inserted into the ZTE sequence at a convenient point, for example at the beginning or at the end of the scan.

Furthermore, the temporal receiver gain variation can be derived from the FID signal acquired at zero readout strength. All signal values of the FID signal correspond to k=0 such that the signal variation directly reflects the temporal variation of the receiver gain during the dead time. The temporal receiver gain curve derived from the FID signal acquired at zero gradient strength can then be used to compensate for the dead time effects in the FID signals acquired at non-zero readout strengths.

The method of the invention described thus far can be carried out by means of a MR device including at least one main magnet coil for generating a uniform steady magnetic field within an examination volume, a number of gradient coils for generating switched magnetic field gradients in different spatial directions within the examination volume, at least one RF coil for generating RF pulses within the examination volume and/or for receiving MR signals from a body of a patient positioned in the examination volume, a control unit for controlling the temporal succession of RF pulses and switched magnetic field gradients, and a reconstruction unit. The method of the invention is preferably implemented by a corresponding programming of the reconstruction unit and/or the control unit of the MR device.

The method of the invention can be advantageously carried out in most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
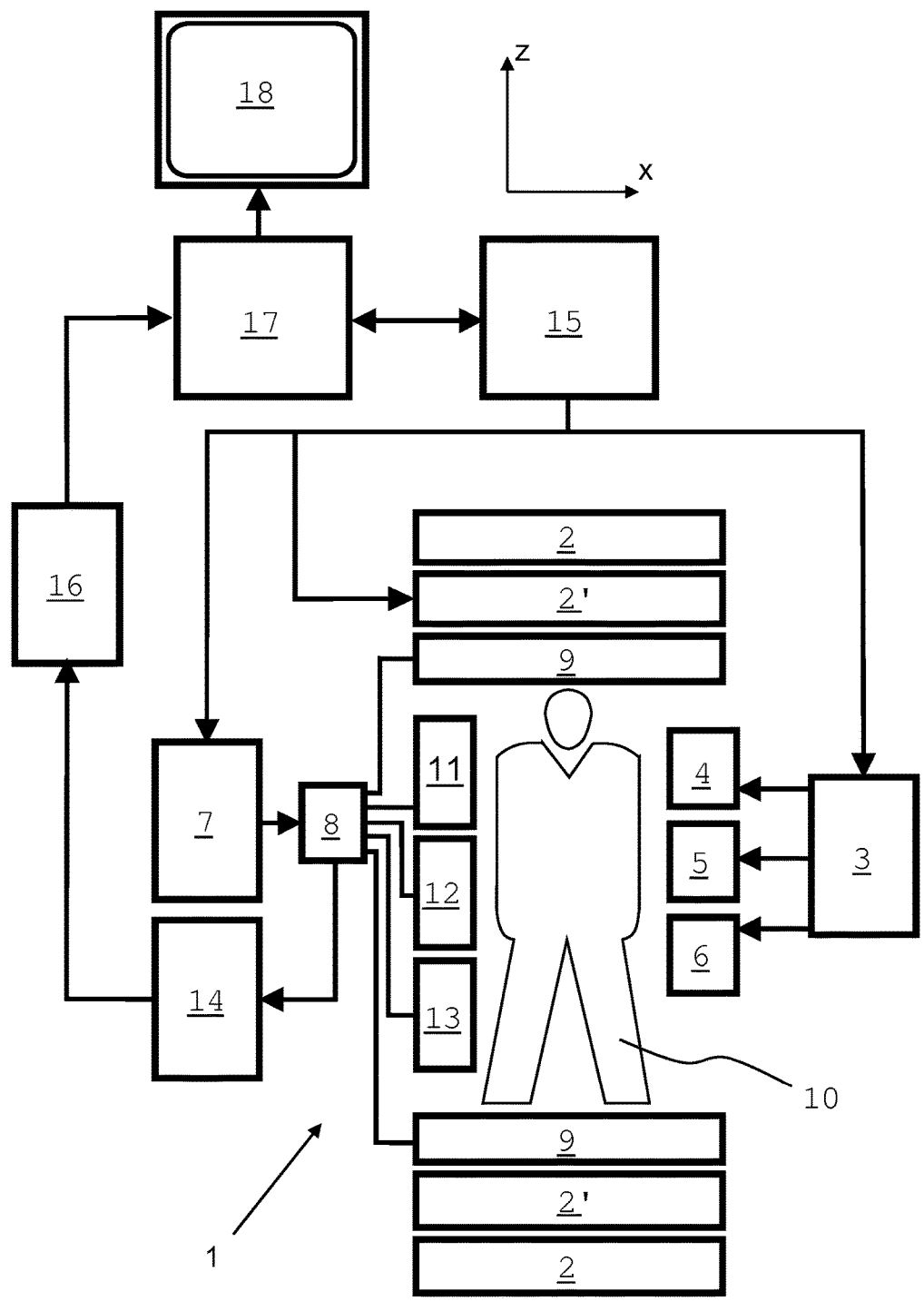
FIG. 1 schematically shows a MR device for carrying out the method of the invention.

With reference to FIG. 1, a MR device 1 which can be used for carrying out the method of the invention is shown. The device comprises superconducting or resistive main magnet coils 2 such that a substantially uniform, temporally constant main magnetic field $B_0$ is created along a z-axis through an examination volume. The device further comprises a set of ($1^{st}$, $2^{nd}$, and—where applicable—$3^{rd}$ order) shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a—body RF coil 9 to transmit RF pulses into the examination volume. A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals are also picked up by the body RF coil 9.

For generation of MR images of limited regions of the body 10 by means of parallel imaging, a set of local array RF coils 11, 12, 13 are placed contiguous to the region selected for imaging. The array coils 11, 12, 13 can be used to receive MR signals induced by body-coil RF transmissions.

The resultant MR signals are picked up by the body RF coil 9 and/or by the array RF coils 11, 12, 13 and demodulated by a receiver 14 preferably including a pre-amplifier (not shown). The receiver 14 is connected to the RF coils 9, 11, 12 and 13 via send-/receive switch 8.

A host computer 15 controls the current flow through the shimming coils 2' as well as the gradient pulse amplifier 3 and the transmitter 7 to generate a ZTE imaging sequence according to the invention. The receiver 14 receives a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies an appropriate reconstruction algorithm. The MR image represents a three-dimensional volume. The image is then stored in an image memory where it may be accessed for converting projections or other portions of the image representation into appropriate format for visualization, for example via a video monitor 18 which provides a human-readable display of the resultant MR image.

Figure 2:
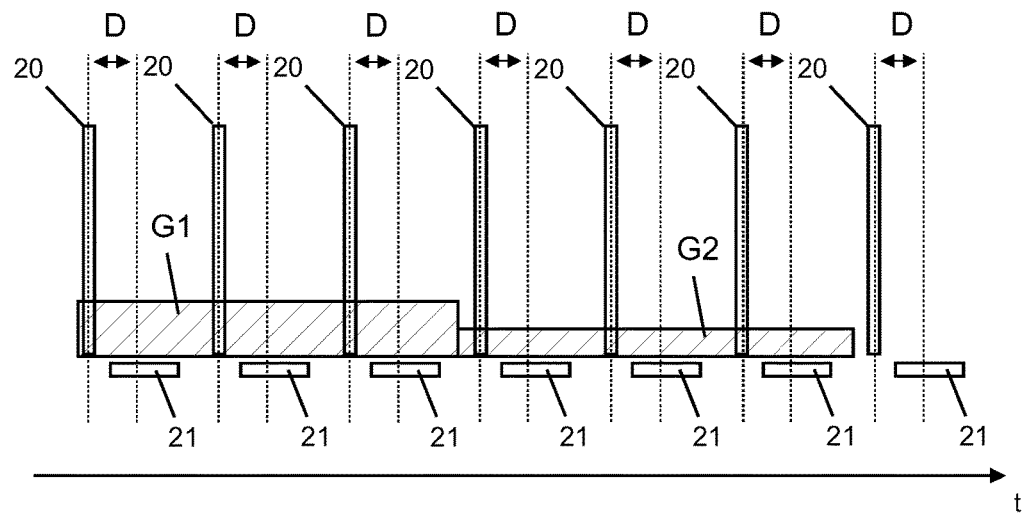
FIG. 2 shows a diagram illustrating the ZTE sequence applied according to the invention.

FIG. 2 shows a diagram illustrating the modified ZTE sequence applied according to the invention. The essence of the 'silent' ZTE technique adopted by the invention is that excitation RF pulses 20 are transmitted simultaneously with the frequency-encoding readout magnetic field gradients G1, G2 being switched on. The readout magnetic field gradient G1, G2 is not intended as a slice-selection gradient which implies that the RF pulses 20 have to be short (typically 1 μs to 8 μs) in order to achieve sufficient excitation bandwidth. That is, the frequency bandwidth of the RF pulses is much wider than the resonance radio frequency range due to the main magnetic field and the superposed applied magnetic gradient fields of the spins in the field of view.

The readout of MR signals takes place during intervals 21 in the presence of the readout magnetic field gradient G1, G2. Each interval 21 has a typical duration between 100 μs and 3 ms. The readout magnetic field gradient G1, G2 has a readout strength and a readout direction both staying substantially constant over each excitation/readout cycle. After each cycle, the readout direction is varied very gradually (not depicted in FIG. 2). The readout direction changes only slightly, e.g. by a few degrees (e.g. 2°). For a full sampling of k-space, the readout direction is varied until a spherical volume is covered with sufficient density.

As mentioned before, a known constraint of conventional ZTE imaging is that there is a finite time between the center of each RF pulse and the start of the respective sampling interval. Depending on the equipment used, this dead time may be anything between 2 μs and 200 μs. As a consequence, the center of k-space cannot be scanned.

In the embodiment of the invention depicted in FIG. 2, the temporal delay between the radiation of each RF pulse 20 and the beginning of the acquisition interval 21 is shorter than the receiver dead time indicated in FIG. 2 by D. Hence, the acquisition of FID signals from the centre region of k-space is corrupted due to the dead time D caused by the duration of the RF pulse, transmit-receive switching, and signal filtering. During the dead time D, the receiver gain of the MR device 1 has not yet achieved its stable level.

According to the invention, the strength of the readout gradient is varied such that at least some of the FID signals are acquired with different readout strengths. As schematically depicted in FIG. 2, the readout strength is switched from G1 to G2 after a number of acquisitions. The readout direction is controlled such that FID signals are acquired with substantially identical readout direction and with different readout strengths G1, G2. The temporal receiver gain variation during the dead time D, which is determined by the hardware properties of the MR device 1 and which turns out to be typically well reproducible, is derived according to the invention by comparing k-space samples acquired at identical k-space positions but at different acquisition times after radiation of the RF pulse. The receiver gain variation may for example be computed by dividing k-space samples acquired from the same k-space positions but at different acquisition times by each other. The dead time effects are then removed from the acquired FID signals by correcting the signals samples according to the determined temporal receiver gain variation. Finally, a MR image is reconstructed from the corrected FID signals.

The afore-described approach of the invention enables to start the acquisition of the FID signals already during the dead time D. i.e. before the receiver has stabilized. Consequently, the invention provides a more accurate acquisition of FID signals from the centre of k-space such that the image quality of ZTE/silent scanning is considerably improved.

Figure 3:
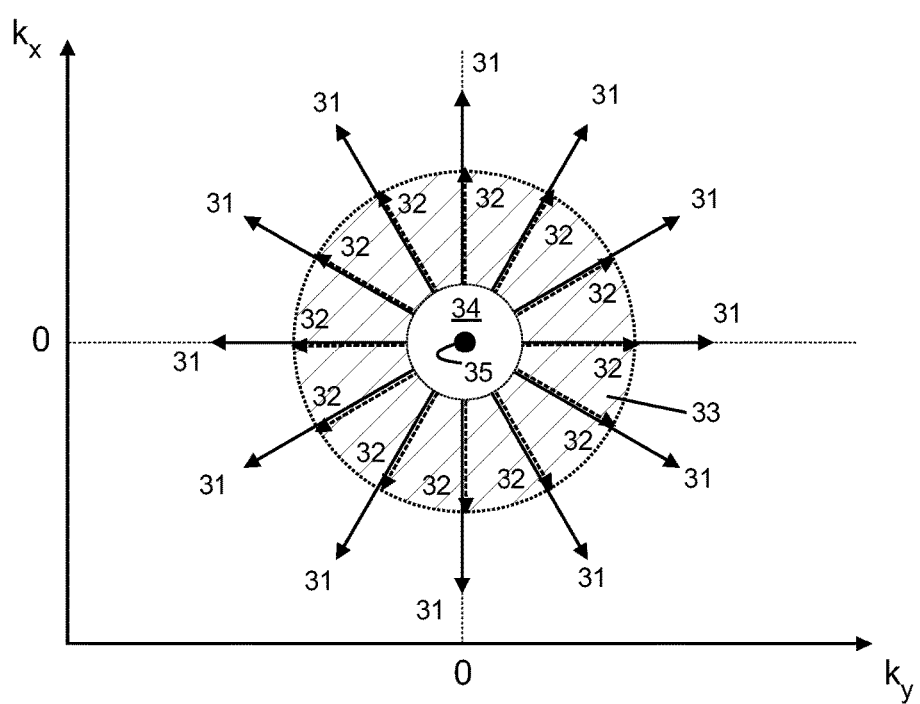
FIG. 3 shows a diagram illustrating the radial sampling of k-space according to an embodiment of the invention.

FIG. 3 shows the k-space sampling scheme of the invention. The diagram shows only the $k_x$ and $k_y$ directions for the purpose of illustration. It has to be noted, however, that a three-dimensional radial sampling of a spherical volume in k-space is performed by the method of the invention. A number of radial k-space lines 31 are acquired as MR signals after each RF pulse 20 at readout strength G1. Further k-space lines 32 are sampled at the reduced readout strength G2. In the ring-shaped hatched area 33, k-space sampling at gradient strengths G1 and G2 overlaps such that the temporal receiver gain variation during the dead time D can be derived according to the invention by comparing k-space samples acquired from area 33.

The size of the central spherical gap 34 is smaller than in conventional ZTE imaging because acquisition of k-space samples 31, 32 already starts during the dead time D, as explained in detail above.

Furthermore, a k-space sample set 35 is acquired at zero readout strength. This measurement directly provides information at k=0. The measurement of k-space sample 35 can be inserted into the ZTE sequence at a convenient point, for example at the beginning or at the end of the scan. In the diagram of FIG. 2, the k=0 sample set is acquired at the end of the sequence. The temporal receiver gain variation can additionally or alternatively be derived directly from the k-space sample 35. Since all signal values of the FID signal of sample 35 correspond to k=0, their signal variation directly reflects the temporal variation of the receiver gain during the dead time D. The temporal receiver gain curve derived from the FID signal acquired at zero gradient strength can then be used to compensate for the dead time effects in the k-space samples 31, 32 acquired at non-zero readout strengths.

The invention claimed is:

1. A method of magnetic (MR) imaging of an object positioned in an examination volume of a MR device, the method comprising the steps of: subjecting the object to an imaging sequence of RF pulses and switched magnetic field gradients, which imaging sequence is a zero echo time sequence comprising:
   i) applying a readout magnetic field gradient having a set readout direction and a set readout strength;
   ii) radiating a RF pulse in the presence of the readout magnetic field gradient;
   iii) acquiring a free induction decay (FID) signal in the presence of the readout magnetic field gradient, wherein the FID signal represents a radial k-space sample, wherein the acquisition of the FID signal is started at an acquisition time at which a receiver gain of the MR device (1) has not yet stabilized after the radiation of the RF pulse;
   iv) gradually varying the setting of the readout direction;
   v) sampling a spherical volume in k-space by repeating steps i) through iv) a number of times; and
   vi) compensating the acquired FID signals for temporal variation of the receiver gain; and
   vii) reconstructing a MR image from the acquired and compensated FID signals.

2. The method of claim 1, wherein the readout strength is varied between repetitions of steps i) through iv).

3. The method of claim 2, wherein the readout strength is varied such that at least two FID signals are acquired with substantially identical readout direction and with different readout strengths.

4. The method of claim 3, wherein the temporal receiver gain variation is derived by comparing k-space samples acquired at identical k-space positions but at different acquisition times after radiation of the RF pulse.

5. The method of MR imaging according to claim 1, wherein at least one FID signal is acquired at zero readout strength.

6. The method of MR imaging according to claim 5, wherein the temporal receiver gain variation is derived from the FID signal acquired at zero readout strength.

7. A magnetic resonance (MR) device comprising at least one main magnet coil for generating a uniform, steady magnetic field within an examination volume, a number of gradient coils for generating switched magnetic field gradients in different spatial directions within the examination volume, at least one RF coil for generating RF pulses within the examination volume and/or for receiving MR signals from an object positioned in the examination volume, a control unit for controlling the temporal succession of RF pulses and switched magnetic field gradients, and a reconstruction unit, wherein the MR device is arranged to perform the following steps:
   subjecting the object to an imaging sequence of RF pulses and switched magnetic field gradients, which imaging sequence is a zero echo time sequence comprising:
   i) applying a readout magnetic field gradient having a set readout direction and a readout strength;
   ii) radiating a RF pulse in the presence of the readout magnetic field gradient;
   iii) acquiring a free induction decay (FID) signal in the presence of the readout magnetic field gradient, wherein the FID signal represents a radial k-space sample, wherein the acquisition of the FID signal is started at an acquisition time at which a receiver gain of the MR device has not yet stabilized after the radiation of the RF pulse;
   iv) gradually varying the setting of the readout direction;
   v) sampling a spherical volume in k-space by repeating steps i) through iv) a number of times;
   vi) compensating the acquired FID signals for temporal variation of the receiver gain; and
   vii) reconstructing a MR image from the acquired and compensated FID signals.

8. A non-transitory computer readable storage medium containing a computer program to be run on a magnetic resonance (MR) device, the computer program comprises instructions for:
   generating an imaging sequence of RF pulses and switched magnetic field gradients, which imaging sequence is a zero echo time sequence comprising:
   i) setting a readout magnetic field gradient having a readout direction and a readout strength;
   ii) radiating a RF pulse in the presence of the readout magnetic field gradient;
   iii) acquiring a free induction decay (FID) signal in the presence of the readout magnetic field gradient, wherein the FID signal represents a radial k-space sample, wherein the acquisition of the FID signal is started at an acquisition time at which a receiver gain of the MR device has not yet stabilized after the radiation of the RF pulse;
   iv) incrementally varying the readout direction;
   v) sampling a spherical volume in k-space by repeating steps i) through iv) a number of times;
   vi) compensating the acquired FID signals for temporal variation of the receiver gain; and
   vii) reconstructing a MR image from the acquired and compensated FID signals.

* * * * *